(12) United States Patent
Chen et al.

(10) Patent No.: US 11,859,284 B2
(45) Date of Patent: Jan. 2, 2024

(54) SHOWER HEAD STRUCTURE AND PLASMA PROCESSING APPARATUS USING THE SAME

(71) Applicant: TAIWAN SEMICONDUCTOR MANUFACTURING COMPANY LTD., Hsinchu (TW)

(72) Inventors: Huan-Chieh Chen, Taichung (TW); Jhih-Ren Lin, New Taipei (TW); Tai-Pin Liu, Hsinchu County (TW); Shyue-Shin Tsai, Tainan (TW); Keith Kuang-Kuo Koai, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 581 days.

(21) Appl. No.: 16/548,845

(22) Filed: Aug. 23, 2019

(65) Prior Publication Data
US 2021/0054506 A1 Feb. 25, 2021

(51) Int. Cl.
*C23C 16/40* (2006.01)
*C23C 16/455* (2006.01)
(Continued)

(52) U.S. Cl.
CPC ........ *C23C 16/45565* (2013.01); *B05B 1/185* (2013.01); *C23C 16/46* (2013.01); *C23C 16/50* (2013.01)

(58) Field of Classification Search
CPC ... B05B 1/185; C23C 16/44; C23C 16/45502; C23C 16/45565; C23C 16/45568; C23C 16/45591; C23C 16/4583; C23C 16/46; C23C 16/50; C23C 16/505; C23C 16/509; H01J 37/3244; H01J 37/32449;
(Continued)

(56) References Cited

U.S. PATENT DOCUMENTS 4,780,169 A * 10/1988 Stark .................... H01J 37/3244
156/345.34
6,050,506 A * 4/2000 Guo ...................... C23C 16/455
239/560

(Continued)

OTHER PUBLICATIONS

Huang, Chih-Hui et al., Film Formation Apparatus and Method for Forming Semiconductor Structure, U.S. Appl. No. 15/922,250, filed Mar. 15, 2018.

(Continued)

*Primary Examiner* — Rudy Zervigon
(74) *Attorney, Agent, or Firm* — WPAT LAW; Anthony King

(57) ABSTRACT

A shower head structure and a plasma processing apparatus are provided. The shower head structure includes a plate body with a first zone and a second zone on a first surface. A plurality of first through holes are in the first zone, each of the first through holes having a diameter uniform with others of the first through holes. A plurality of second through holes are in the second zone. The first zone is in connection with the second zone, and the diameter of each of the first through holes is greater than a diameter of each of the second through holes. A plasma processing apparatus includes the shower head structure is also provided.

20 Claims, 9 Drawing Sheets

(51) Int. Cl.
*C23C 16/46* (2006.01)
*C23C 16/50* (2006.01)
*B05B 1/18* (2006.01)

(58) Field of Classification Search
CPC ......... H01L 21/02107; H01L 21/02271; H01L 21/68714; H01L 2224/02317; H01L 2224/0236; H01L 2224/02379; H01L 24/02; H01L 2924/35121; H01L 2924/37001
USPC .......... 118/715, 728, 50; 156/345.33, 345.34
See application file for complete search history.

(56) References Cited

U.S. PATENT DOCUMENTS

| | | | | |
|---|---|---|---|---|
| 6,059,885 | A * | 5/2000 | Ohashi | C23C 16/45574 118/730 |
| 6,428,850 | B1 * | 8/2002 | Shinriki | C23C 16/409 427/255.32 |
| 6,565,661 | B1 * | 5/2003 | Nguyen | C23C 16/45565 118/715 |
| 8,083,853 | B2 * | 12/2011 | Choi | H01J 37/3244 156/345.43 |
| 10,526,703 | B2 * | 1/2020 | Huang | C23C 16/45568 |
| 11,041,242 | B2 * | 6/2021 | Huang | H01L 24/02 |
| 2003/0019580 | A1 * | 1/2003 | Strang | C23C 16/45589 156/345.33 |
| 2003/0029381 | A1 * | 2/2003 | Nishibayashi | C23C 16/52 118/712 |
| 2003/0209323 | A1 * | 11/2003 | Yokogaki | C23C 16/45565 156/345.34 |
| 2004/0031565 | A1 * | 2/2004 | Su | H01L 21/67017 156/345.33 |
| 2004/0061447 | A1 * | 4/2004 | Saigusa | H01J 37/3255 315/111.21 |
| 2005/0126484 | A1 * | 6/2005 | Zhao | H01J 37/3244 118/715 |
| 2005/0251990 | A1 * | 11/2005 | Choi | H01J 37/3244 29/558 |
| 2006/0228496 | A1 * | 10/2006 | Choi | H01J 37/3244 427/569 |
| 2006/0260749 | A1 * | 11/2006 | Ueda | H01L 21/67069 156/345.34 |
| 2007/0068625 | A1 * | 3/2007 | Funk | C23C 16/45565 156/345.29 |
| 2008/0141941 | A1 * | 6/2008 | Augustino | H01L 21/67069 118/723 R |
| 2008/0178805 | A1 * | 7/2008 | Paterson | H01J 37/32357 118/723 I |
| 2008/0302303 | A1 * | 12/2008 | Choi | C23C 16/45565 438/758 |
| 2009/0104376 | A1 * | 4/2009 | Choi | C23C 16/45559 427/578 |
| 2009/0275206 | A1 * | 11/2009 | Katz | H01J 37/32449 438/714 |
| 2010/0003406 | A1 * | 1/2010 | Lam | C23C 16/4412 427/255.391 |
| 2010/0163187 | A1 * | 7/2010 | Yokogawa | H01J 37/3244 156/345.34 |
| 2010/0178775 | A1 * | 7/2010 | Okesaku | H01J 37/3255 438/726 |
| 2010/0288197 | A1 * | 11/2010 | Choi | H01J 37/32559 118/723 R |
| 2012/0100307 | A1 * | 4/2012 | Aida | C23C 16/45565 427/569 |
| 2012/0111271 | A1 * | 5/2012 | Begarney | C23C 16/4584 118/724 |
| 2013/0052346 | A1 * | 2/2013 | Higashi | C23C 16/45519 427/248.1 |
| 2013/0052804 | A1 * | 2/2013 | Song | C23C 16/45574 438/478 |
| 2013/0295297 | A1 * | 11/2013 | Chou | C23C 16/45565 427/569 |
| 2013/0306758 | A1 * | 11/2013 | Park | C23C 16/345 239/418 |
| 2013/0319612 | A1 * | 12/2013 | Su | H01J 37/3244 156/345.24 |
| 2014/0150713 | A1 * | 6/2014 | Coe | C30B 25/02 117/88 |
| 2015/0247237 | A1 * | 9/2015 | Ha | H01J 37/32449 118/715 |
| 2016/0047042 | A1 * | 2/2016 | Higashi | H01J 37/32834 239/548 |
| 2016/0260603 | A1 * | 9/2016 | Dhas | C23C 16/5096 |
| 2016/0340781 | A1 * | 11/2016 | Thomas | C23C 16/52 |
| 2016/0340782 | A1 * | 11/2016 | Chandrasekharan | C23C 16/52 |
| 2017/0081763 | A1 * | 3/2017 | Tiner | C23C 16/5096 |
| 2017/0167024 | A1 * | 6/2017 | Wiltse | C23C 16/45565 |
| 2018/0096843 | A1 * | 4/2018 | Kulshreshtha | C23C 16/26 |
| 2018/0174870 | A1 * | 6/2018 | Yang | H01L 21/31138 |
| 2018/0286696 | A1 * | 10/2018 | Ogawa | H01J 37/3244 |
| 2019/0024234 | A1 * | 1/2019 | Kamio | C23C 16/52 |
| 2019/0032215 | A1 * | 1/2019 | Lo | C23C 16/46 |
| 2019/0062918 | A1 * | 2/2019 | Shaikh | C23C 16/45519 |
| 2019/0218665 | A1 * | 7/2019 | Chang | H01J 37/3244 |
| 2019/0284695 | A1 * | 9/2019 | Huang | H01L 24/02 |
| 2020/0141004 | A1 * | 5/2020 | Huang | C23C 16/45502 |
| 2021/0054506 | A1 * | 2/2021 | Chen | H01J 37/3244 |

OTHER PUBLICATIONS

Chen, Huan-Chieh et al., Chemical Vapor Deposition Apparatus and Blocker Plate, U.S. Appl. No. 16/455,172, filed Jun. 27, 2019.

* cited by examiner

SHOWER HEAD STRUCTURE AND PLASMA PROCESSING APPARATUS USING THE SAME

FIELD

The present disclosure is related to a shower head structure and, more particularly, to a shower head structure with a plurality of shrink through holes near an edge thereof.

BACKGROUND

Plasma-enhanced chemical vapor deposition (PECVD) process is widely used in the semiconductor industry for depositing materials such as silicon dioxide on the substrate under a low temperature, while the deposition rate is still comparable to other chemical vapor deposition (CVD) process. The deposition at low temperature works good for materials that are temperature sensitive or those who may get their characteristics changed at high temperatures. However, arcing may occur during the PECVD process, and both of the lifetimes of such plasma apparatus and the deposited products may be influenced by the arcing seriously.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
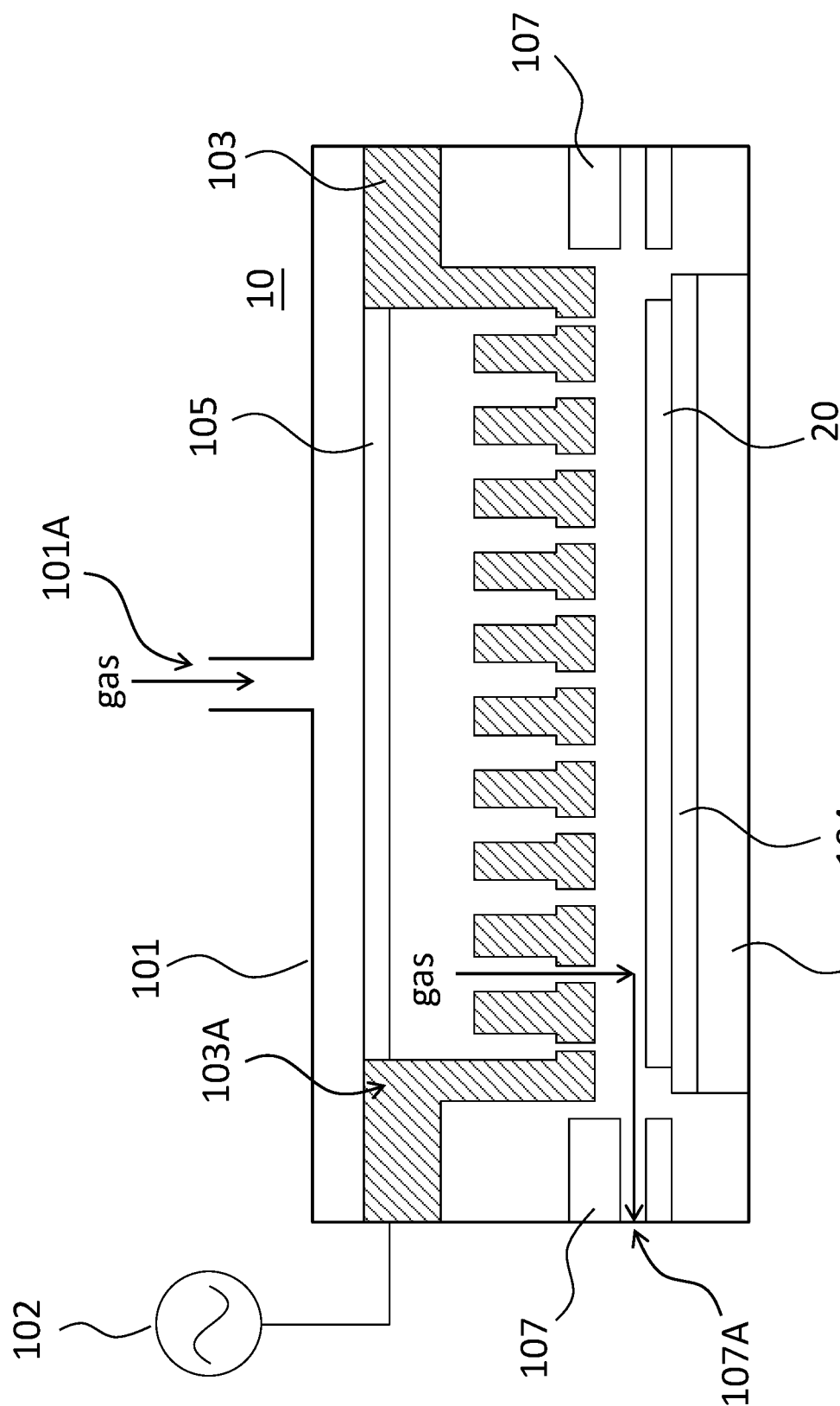
FIG. 1 illustrates a cross-sectional view of a plasma processing apparatus according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

CVD is a chemical-based process used to deposit thin semiconductor material films or layers on a substrate such as a wafer in the formation of integrated circuit devices such as chips and dies. CVD apparatus generally includes a reaction chamber configured for accommodating a wafer. During the deposition process, a reactant gas containing the desired film material chemical precursors is introduced into the reaction chamber to form the semiconductor film. The reaction grows or deposits a generally thin film on the wafer surface which can include a wide array of film materials such as silicon dioxide ($SiO_2$), silicon oxynitride (SiON), polysilicon, silicon nitride (SiN) dielectrics, etc.

CVD process may be further classified into several types, including atmospheric pressure CVD, metalorganic CVD, low pressure CVD, laser CVD, photo-CVD, chemical vapor infiltration, chemical beam epitaxy, microwave plasma-assisted CVD and plasma-enhanced CVD, depends on the deposition conditions such as different gas pressure or different precursors. Among the CVD processes, plasma-enhanced CVD (PECVD) is the one that most common and widely used in semiconductor industry because it may extend the applicability of CVD for various precursors, reactive organic and inorganic materials as well as inert materials.

In a PECVD process, deposition is achieved by introducing reactant gases between parallel electrodes. In some circumstances, one is a grounded electrode and the other one is a radiofrequency (RF) energized electrode. The capacitive coupling between the electrodes excites the reactant gases into plasma, which induces a chemical reaction and results in the reaction product being deposited on a substrate placed on the grounded electrode. The substrate is typically heated to about 250 degrees Celsius to about 350 degrees Celsius. In comparison, standard CVD process requires about 600 degrees Celsius to about 800 degrees Celsius. The lower deposition temperatures are critical in many applications where CVD temperatures could damage the devices being fabricated.

The plasma in PECVD process may be generated by different method, including microwave frequency plasma, RF plasma, and arc plasma. By utilizing the RF energized in a reaction chamber, for instance, the RF power is applied to a gas flow to ionize the reactant gas thereof and thus the RF plasma is formed. The gas flow is provided by a shower head structure which has a plurality of through holes to introduce the gas into the reaction chamber. However, when RF power is provided, the electric charges may be accumulated near the edge of the shower head, particularly, a significant amount of the electric charges are accumulated at a corner structure where the shower head connects to or fixes to other devices of the PECVD apparatus. As a result, the through holes near the edge of the shower head may be analogous to hollow cathode walls and thus arcing occurs therein.

The arcing originated from RF plasma can result in a high density of micro particles and contamination by vapor from the micro discharge depositing on the substrate and low pressure system surfaces and result in electrical damage, for instance, the through holes may thus be stuck and the shower head needs to be replaced frequently. Such arcing issue may happen during the formation of low-k (ELK) dielectric films on a substrate by PECVD, which usually has a process pressure under 8 torr due to the thickness uniformity requirement. Relations between breakdown voltage and gas pressure can be referred to Paschen's law. Paschen's law is an equation that gives the breakdown voltage, that is, the voltage necessary to start a discharge or electric arc, between two electrodes in a gas as a function of pressure and gap length. Under the condition where gap length is fixed, the breakdown voltage reaches local minimum when the gas pressure reduces. To prevent arcing from occurring in low pressure technology, for example, advanced ELK deposition, modified shower head structure is provided in the present disclosure. Moreover, the arcing also occurs in some plasma-enhanced etching process because the shower head used is similar to that in plasma-enhanced deposition process.

Therefore, in order to prevent arcing occurs inside the through holes of shower head, the present disclosure provides a shower head structure which may prevent the occurrence of arcing by itself, which means the process parameters of PECVD (e.g. the frequency of RF power and the pressure) or plasma-enhanced etching may not to be changed to reduce the occurrence rate of arcing. In other words, the present disclosure provides a shower head structure which solves the arcing issue and being compatible with current PECVD process and plasma-enhanced etching without changing recipe or parameters of manufacturing process used in current art.

As shown in FIG. 1, the plasma processing apparatus of the present disclosure includes a reaction chamber 101 (or simply called chamber), a radio frequency (RF) power source 102, a shower head 103, and a susceptor 104. In some embodiments, the plasma processing apparatus further includes a blocker plate 105, a heater 106, and a liner 107.

Referring to the cross section of the plasma processing apparatus as shown in FIG. 1, the RF power source 102 is coupled to the reaction chamber 101; the shower head 103 is disposed in the reaction chamber 101 and coupled to the RF power source 102; the susceptor 104 is disposed below the shower head 103. In some embodiments, the blocker plate 105 is disposed over the shower head 103 in the reaction chamber 101, the heater 106 is disposed below the susceptor 104, and the liner 107 is disposed at a side of the reaction chamber 101.

The present disclosure is related to a plasma processing apparatus and thus the power supply is a RF power source 102 which may provide a high voltage sufficient to ionize a reactant provided from the shower head 103. More precisely, the high voltage is provided to generate plasma in the reaction chamber 101. In some embodiments, an edge 103A of the shower head 103 is physically connected to the RF power source 102.

In some embodiments, a gas supply system or a gas box (not shown) is coupled to the shower head 103 and it is operable to dispense the gas to the substrate 20 inside the reaction chamber 101 through a gas inlet 101A of the reaction chamber 101. The gas supply system may dispense the gas such as reactant gas or dilution gas to the shower head 103 through various apparatus such as flow lines, pressure regulators, valves, mass flow controllers, or other flow controllers, manifolds, and/or regulators. In some embodiments, the gas may leave the reaction chamber 101 through the gas outlet 107A constructed by the liner 107.

In some embodiments, the gas is redistributed by the blocker plate 105 before being dispensed by the shower head 103. In some embodiments, the blocker plate 105 is a circular plate having a plurality of through holes configured to redistribute the gas. In some embodiments, the gas inlet 101A of the reaction chamber 101 is over a center of the blocker plate 105.

In some embodiments, the substrate 20 can be a silicon substrate, a III-V compound substrate, a glass substrate, a liquid crystal display substrate, a printed circuit board (PCB), or any other substrate similar thereto. In some embodiments, the substrate 20 is a blank substrate or includes a variety of integrated devices or circuits, or layer for forming such thereon.

During the deposition process, the substrate 20 is placed on the susceptor 104. The susceptor 104 is configured to hold the substrate 20 in place, and a first surface (later shown in FIG. 2A) of the shower head 103 is facing the susceptor 104. In some embodiments, the susceptor 104 may be a pedestal, wafer chuck and/or other wafer holding apparatus. During the deposition process, the substrate 20 is heated by the heater 106 below. In some embodiments, the heater 106 is a heating plate. In some embodiments, the heater 106 is integrated with the susceptor 104 and thus the substrate 20 is held and heated by the integrated device solely.

Figures 2A, 2B:
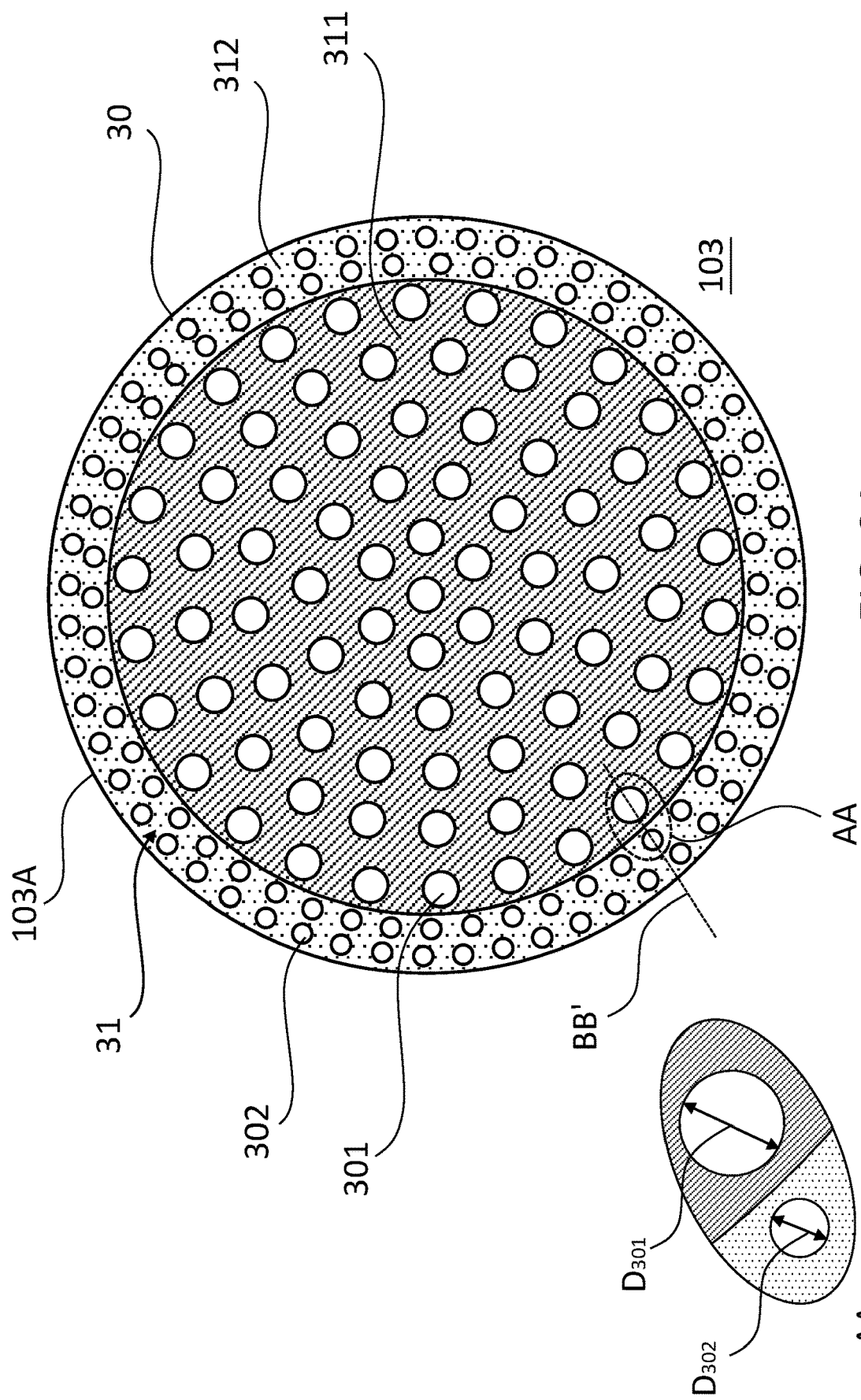
FIG. 2A illustrates a bottom view of a shower head structure in accordance with some embodiments of the present disclosure.
FIG. 2B illustrates an enlarged portion of AA in FIG. 2A of the present disclosure.

As mentioned previously, the present disclosure is to prevent arcing occurs inside the holes at the edge of the shower head 103. Generally, the shower head 103 is a circular plate having a plurality of through holes configured to distribute the process gas. As shown in FIG. 2A, the shower head includes a plate body 30, a plurality of first through holes 301 and a plurality of second through holes 302. The plate body 30 includes a first surface 31. The first surface 31 includes a first zone 311 and a second zone 312, and the first through holes 301 are disposed in the first zone 311 and the second through holes 302 are disposed in the second zone 312.

The first zone 311 is in connection with the second zone 312. In some embodiments, the first zone 311 is at the central region of the plate body 30 and the second zone 312 is at the peripheral region of the plate body 30. In some embodiments, the first zone 311 is surrounded by the second zone 312. In some embodiments, the second zone 312 is closer to an edge 103A of the shower head 103 than the first zone 311. In some embodiments, the second zone 312 is a band region surrounds the first zone 311. Because the first through holes 301 and the second through holes 302 are disposed in the first zone 311 and the second zone 312, respectively, the positions of the first zone 311 and the second zone 312 determines the distribution of the first through holes 301 and the second through holes 302 on the first surface 31 of the plate body 30.

In some embodiments, the diameter of the plate body 30 is in a range of from about 300 mm to about 400 mm. In some embodiments, the diameter of the plate body 30 is about 350 mm. In some embodiments, the size of the first zone 311 and the second zone 312 are proportional, and the ratio between a diameter of the first zone 311 and a diameter of the plate body 30 (or a diameter of an outer perimeter of the second zone 312) is in a range of from about 0.7:1 to about 0.8:1. Accordingly, in some embodiments, the first zone 311 is a circular region at the central region of the plate body 30 with a diameter about 260 mm, and the second zone 312 is a band region surrounds the first zone 311 with a diameter of an inner perimeter identical to the diameter of the first zone 311 and a diameter of the outer perimeter identical to the diameter of the plate body 30. In some comparative embodiments, it is observed that arcing occurs in the through holes located at about 0.74 time of the diameter of the plate body 30 to the edge of the plate body 30 due to charge accumulation at corners. As a result, in some embodiments, current plate body 30 allocate the plurality of second through holes 302 in the second zone 312 located at about 0.74 time of the diameter of the plate body 30 to the edge of the plate body 30.

In the present disclosure, as shown in FIG. 2B which enlarges the area AA in FIG. 2A, the diameter $D_{301}$ of each of the first through holes 301 is different to the diameter $D_{302}$ of each of the second through holes 302. The different diameter of the through holes of the shower head 103 may provide different performances in preventing arcing. In RF plasma, ions and electrons are oscillating within a small limited space, for instance, the through holes of the shower head 103 of the present disclosure is less than 1.2 mm in some embodiments. Thereby the densities of electrons and ions in such a region become so high that both electrons and ions spread out toward the outside of plasma. That is, the electrons and ions collide with the sidewall of the through hole at first, and the number of such collisions is proportional to the density and the thermal velocity of electrons or ions. However, the thermal velocity of electrons is about three orders of magnitude larger than that of ions. Accordingly, the flow of electrons from plasma to the sidewall of the through hole becomes much larger than that of ions.

Figure 3:
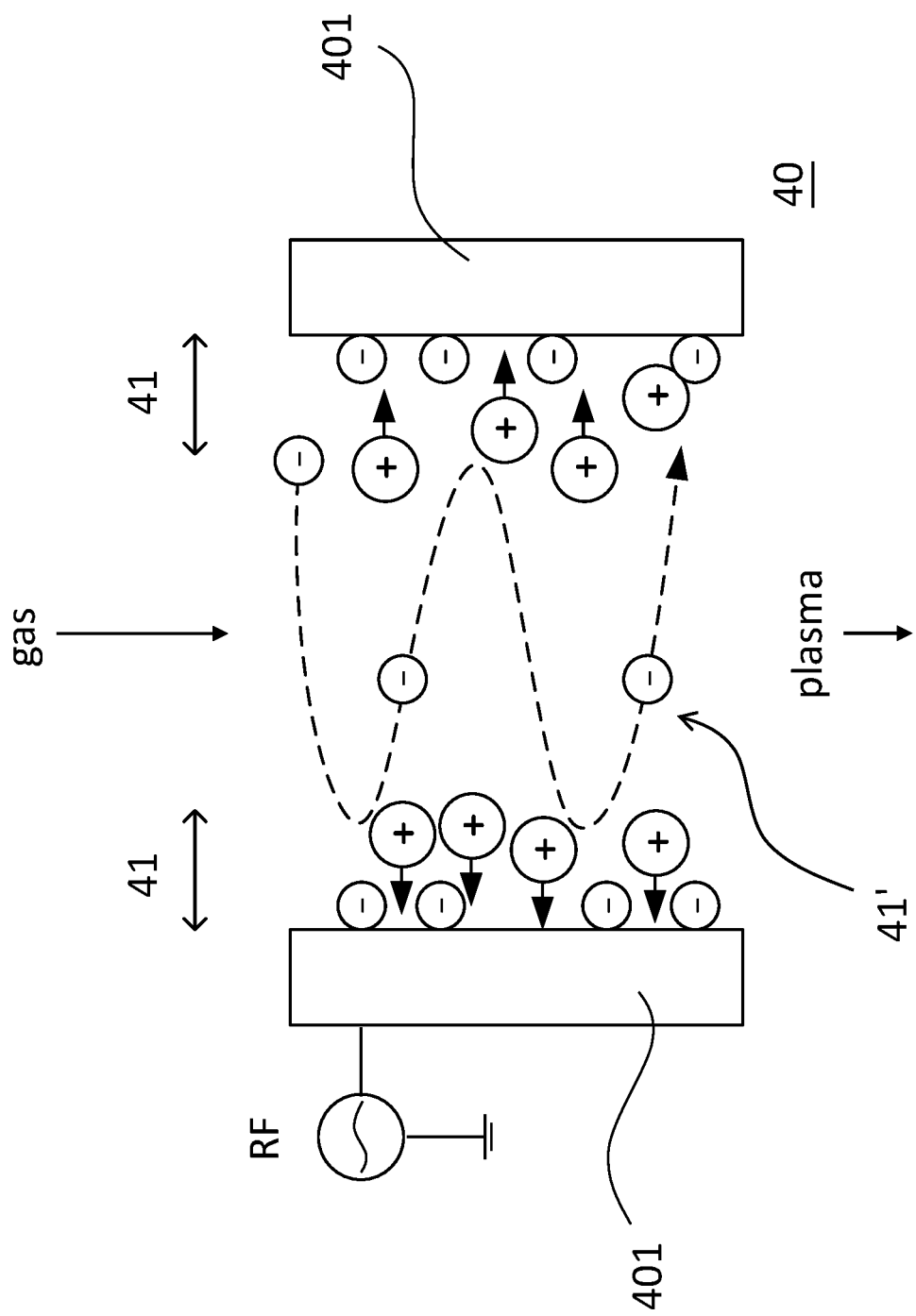
FIG. 3 illustrates a cross-sectional view of a portion of a through hole according to some comparative embodiments of the present disclosure.

Referring to some comparative embodiments of FIG. 3, according to the cross section of the through hole 40, a plurality of sheath layers 41 may be formed near the inside walls 401 of the through holes 40 during the PECVD process. As aforementioned, the electrons may spread out toward the outside of plasma and thus escape to the sidewall of the through hole due to higher thermal velocity, thereby materials in contact with plasma will generally charge negatively with respect to the plasma potential. In some comparative embodiments, the wall 401 charges negatively until a positive electric field is created due to charge separation. Plasma 41' is then stabled between the sheath layers 41. Accelerated ions and retarded electrons arrive at the walls at an equal rate preserving charge neutrality and forming an equilibrium boundary. That is, the sheath (also called Debye sheath) layer 41 is formed where the greater density of positive ions balance an opposite negative charge on the surface of a material with which it is in contact with.

Micro hollow cathode discharge is prone to occur in the through hole 40 at the presence of stabled plasma 41' under the condition of low pressure at operating RF power. The present disclosure provides a plurality of second through holes 302 each with a reduced hole diameter to an extent that the sheath layer 41 being close enough or substantially merged and rendering no room for the plasma to be stable in the second through holes 302.

Figure 4:
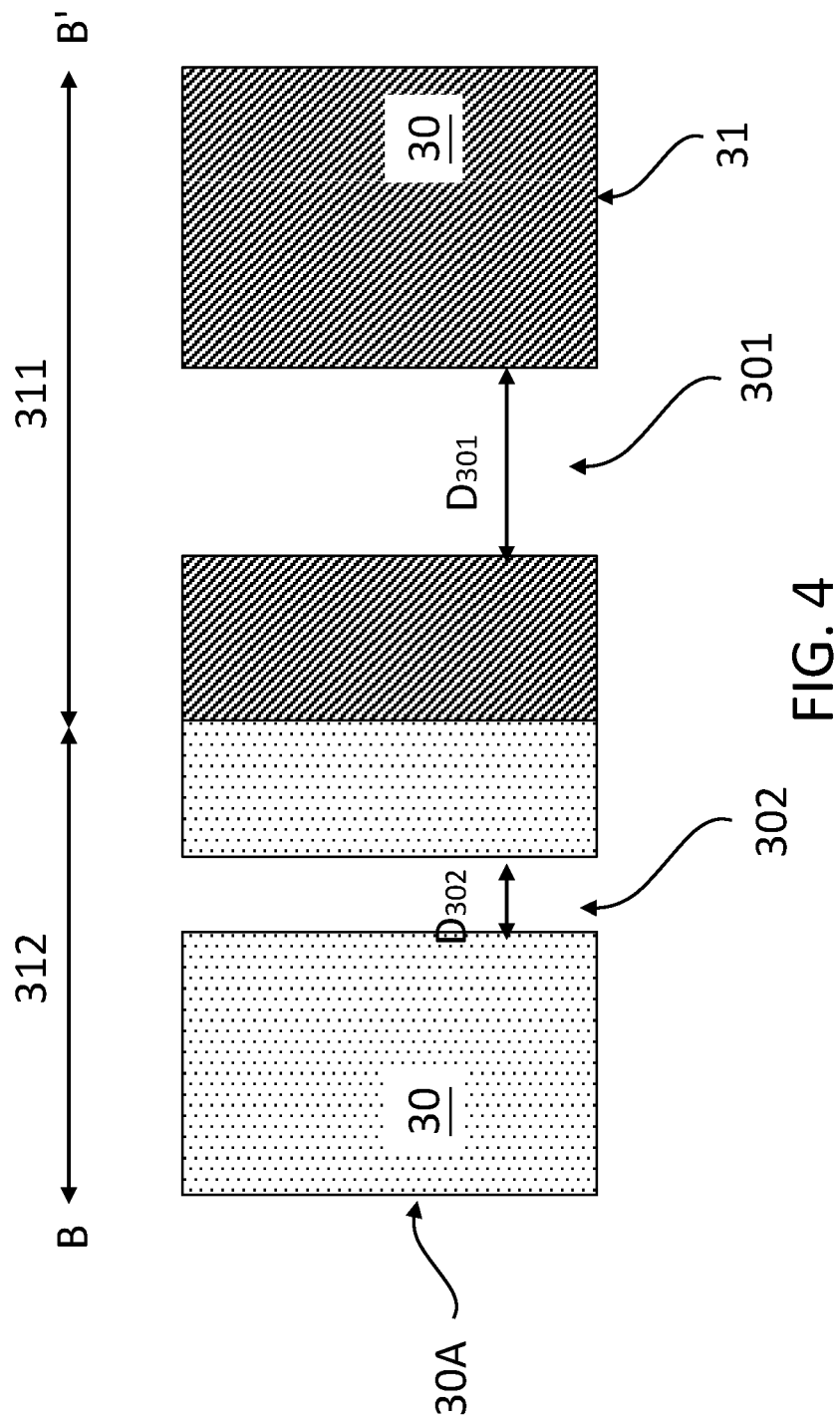
FIG. 4 illustrates a cross-sectional view of an enlarged portion of AA in FIG. 2A of the present disclosure.

An enlarged cross-sectional view taken along a line BB' in area AA in FIG. 2A is shown in FIG. 4. Referring to the figures, the diameters of the first through hole 301 and the second through hole 302 are different. In some embodiments, the diameter $D_{301}$ of each of the first through holes 301 is greater than the diameter $D_{302}$ of each of the second through holes 302. The present disclosure reducing the diameters $D_{302}$ of the second through holes 302 from a conventional dimension, for example, the diameter $D_{301}$, to make the inside walls of each second through hole 302 closer than that of each first through hole 301, so that the sheath layers therein may be closer, or substantially merged, in the second through holes 302 during the PECVD process. The reduced diameter $D_{302}$ of the second through holes 302 reduces the possibility of micro hollow cathode discharge and thus the arcing inside the second through holes 302.

The size of the through holes near the edge 30A of the plate body 30 is shrunk to a certain degree. Compared to the through holes near a center of the plate body 30, the shrinking percentage of the through holes near the edge 30A is larger than 10% of the through holes near the center. In other words, the diameter $D_{302}$ of each of the second through holes 302 is less than 90% of the diameter $D_{301}$ of each of the first through holes 301. In some embodiments, the shrinking percentage of the through holes near the edge 30A is larger than 15% of the through holes near the center. In other words, the diameter $D_{302}$ of each of the second through holes 302 is less than 85% of the diameter $D_{301}$ of each of the first through holes 301.

By shrinking the through holes near the edge 30A of the plate body 30, in some embodiments, the diameter $D_{302}$ of each of the second through holes 302 is in a range of from about 0.3 mm to about 0.7 mm. In some embodiments, the diameter $D_{302}$ of each of the second through holes 302 is less than about 0.6 mm.

Figure 5:
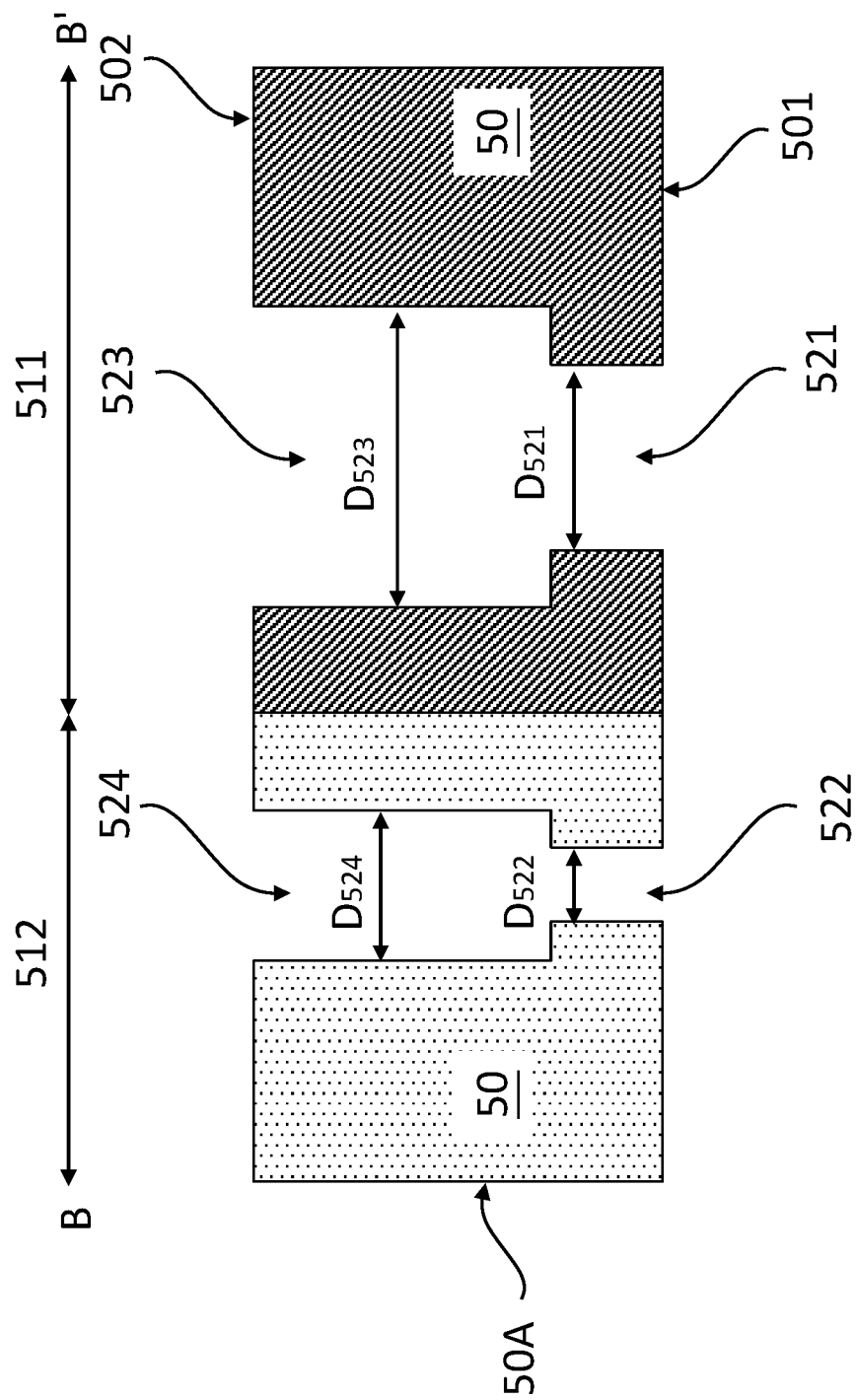
FIG. 5 illustrates a cross-sectional view of an enlarged portion of AA in FIG. 2A of the present disclosure.

As shown in FIG. 5, in some embodiments, the plate body 50 of the shower head having a first surface 501 and a second surface 502 opposite to the first surface 501, and the plate body 50 further includes a first zone 511 and a second zone 512. Both of the first zone 511 and the second zone 512 may be identified from the view of the first surface 501 and the second surface 502. The relationship between the first zone 511 and the second zone 512 is similar to the relationship described in accordance with FIG. 2, and the detailed descriptions of such relationship are omitted herein for brevity.

In the present disclosure, each hole of the shower head in some embodiments may penetrate through the plate body 50 and forms openings at the first surface 501 and the second surface 502. As shown in FIG. 5, in some embodiments, a first hole 521 opens at the first surface 501 and in the first zone 511, a second hole 522 opens at the first surface 501 and in the second zone 512, a third hole 523 opens at the second surface 502 and in the first zone 511, and a fourth hole 524 opens at the second surface 502 and in the second zone 512. Moreover, the third hole 523 is in connection with the first hole 521, and the fourth hole 524 is in connection with the second hole 522.

Because the present disclosure is to prevent arcing occurs inside through holes at the edge of the shower head, in some embodiments, the holes opened at the second surface 502 are similar with the holes opened at the first surface 501 that the holes closer to the edge 50A of the plate body 50 are shrunk to smaller than the holes near the center of the plate body 50. In other words, in some embodiments, not only the diameter $D_{521}$ of the first hole 521 is greater than the diameter $D_{522}$ of the second hole 522 at the first surface 501, but also the diameter $D_{523}$ of the third hole 523 is greater than the diameter $D_{524}$ of the fourth hole 524 at the second surface 502. Referring to FIG. 1 and FIG. 5, the first surface 501 may face the susceptor 104 and the second surface 502 may face the blocker plate 105.

Although each hole of the shower head in some embodiments may penetrates through the plate body 50 and forms openings at each surface thereof, in some embodiments, each hole includes more than one inner diameter. Accordingly, the first hole 521 and the corresponded third hole 523, and the second hole 522 and the corresponded fourth hole 524 may have different diameters. In some embodiments, the diameter $D_{521}$ of the first hole 521 is in a range of from about 0.7 mm to about 1.1 mm; the diameter $D_{522}$ of the second hole 522 is in a range of from about 0.3 mm to about 0.7 mm, and in some embodiments, the diameter $D_{522}$ of the second hole 522 is shrunk to less than 0.5 mm; the diameter $D_{523}$ of the third hole 523 is in a range of from about 1.0 mm to about 1.4 mm; and the diameter $D_{524}$ of the fourth hole 524 is in a range of from about 0.7 mm to about 1.2 mm. In some embodiments, the diameter $D_{522}$ of the second hole 522 is smaller than the diameter $D_{524}$ of the fourth hole 524.

In order to maintain the gas flow amount via the through holes in the second zone, in some embodiments, an area of the first through holes per unit area is equal to an area of the second through holes per unit area. Accordingly, even though the diameter of the second through holes are shrunk to smaller than the diameter of the first through holes, no substantial influence is induced to the PECVD process or plasma-enhanced etching process because the total area of the through holes opened at the second zone is not changed. In other words, comparing to a shower head structure without shrinking the through holes, some embodiments of the present disclosure may provide identical functions. Moreover, taking into account the diameter ratio of the first zone and the second zone, in some embodiment, an amount of the first through holes per unit area is less than an amount of the second through holes per unit area under the circumstances that the amount of the gas flow in the second zone is maintained.

Figure 6:
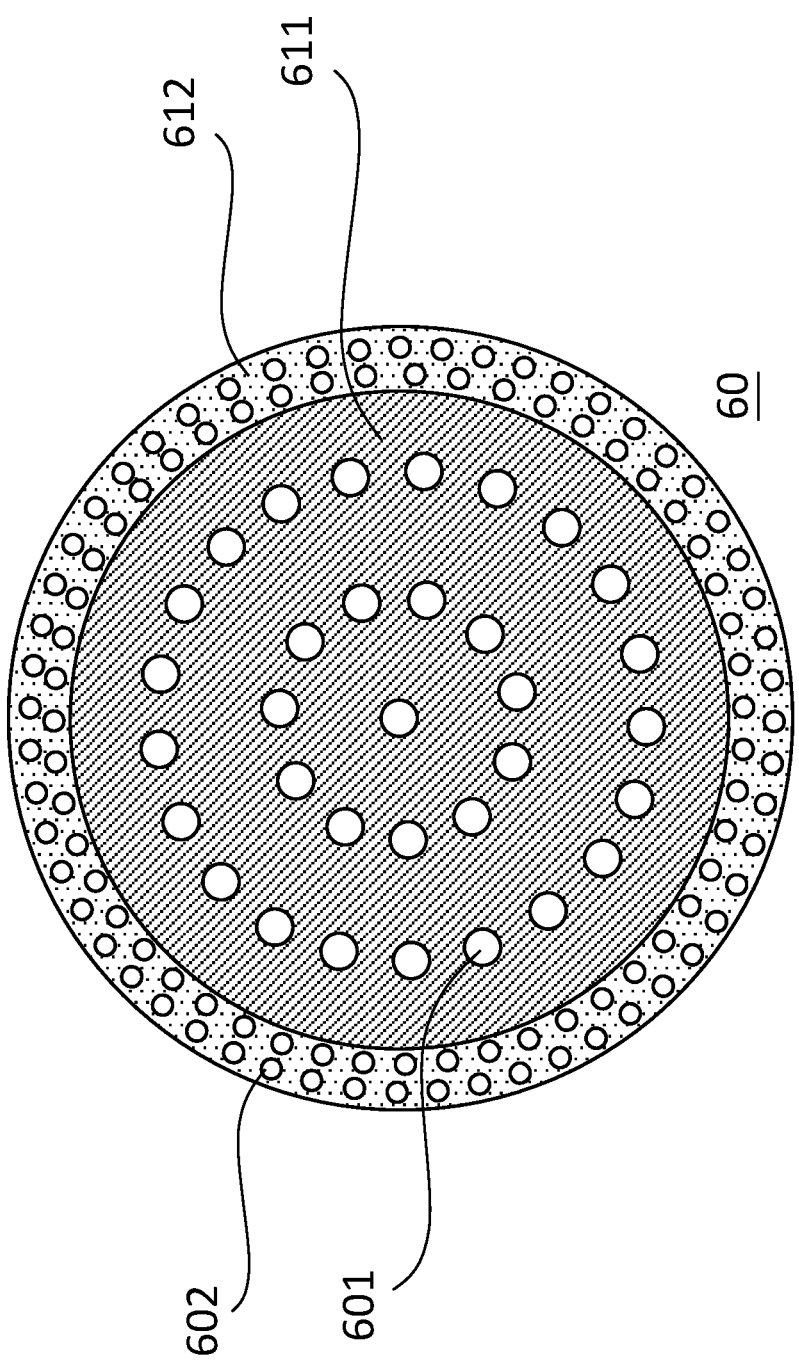
FIG. 6 illustrates a bottom view of a shower head structure in accordance with some embodiments of the present disclosure.

In addition, as shown in FIG. 6, under the shrinking of the second through holes 602 in the second zone 612 of the plate body 60, in some embodiments, the second through holes 602 distributed in the second zone 612 have a density greater than the density of the first through holes 601 distributed in the first zone 611.

Figure 7:
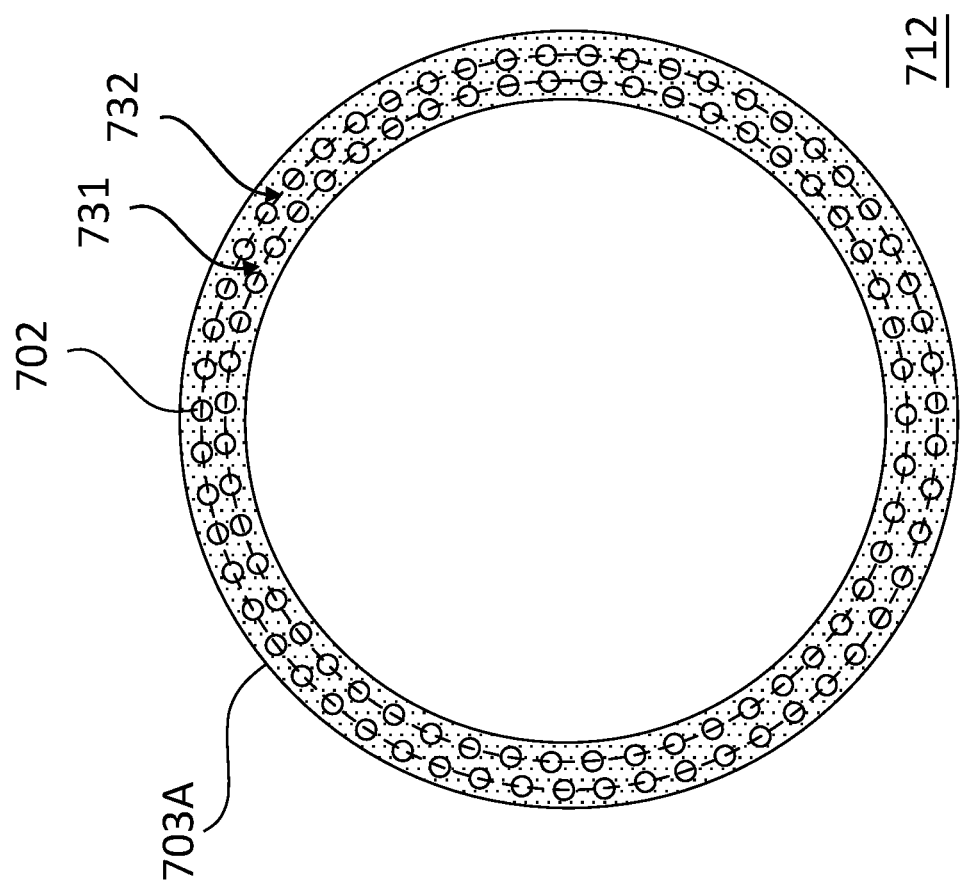
FIG. 7 illustrates a bottom view of a second zone of a shower head design in accordance with some embodiments of the present disclosure.

As shown in FIG. 7, in some embodiment, because the second through holes 702 are shrunk to a smaller size and the amount thereof is increased to be greater than the first through holes per unit area, as shown in FIG. 6, the second through holes 702 are thus arranged in at least a first band 731 and a second band 732 concentrically. The second through holes 702 in the second band 732 may be staggerly disposed with respect to the second through holes 702 in the first band 731. Moreover, a third band (not shown) can be added to the second zone 712 and having through holes staggerly disposed with respect to the second through holes 702 in the second band 732. In such embodiments, the concentric distribution may satisfy the features that the amount of the second through holes 702 is greater than the first through holes but the second zone 712 is a band region closer to the edge 703A of the shower head structure. For instance, in some embodiments, the second zone 712 is a band region from about 0.7 times of a radius of the shower head structure to an edge 703A of the shower head structure.

Comparing to a shower head without shrinking the through holes, in some embodiments, the total area of the second through holes open at the second zone may be decreased. In such embodiments, the area of the first through holes per unit area is greater than the area of the second through holes per unit area. In other words, although the diameter of the second through holes are shrunk to less than the diameter of the first through holes, the amount of the second through holes are not increased to compensate the gas flow lost. In such embodiments, the deposition or etching requirement is to have a higher conductance at a center and a lower conductance at an edge of an underlying substrate.

Figure 8A:
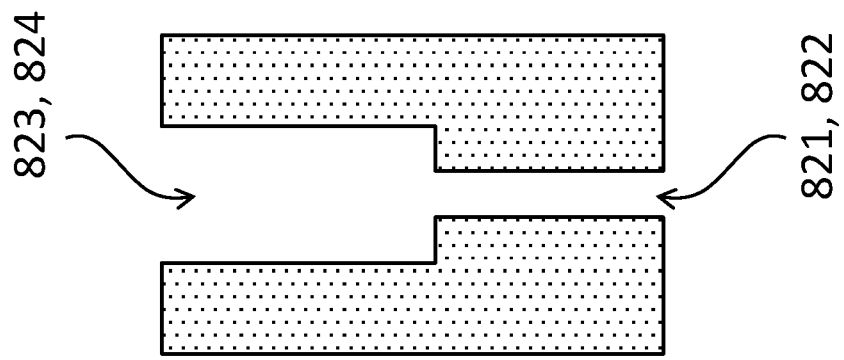
FIGS. 8A to 8D illustrate cross-sectional views of the through holes according to some embodiments of the present disclosure.
Figure 8B:
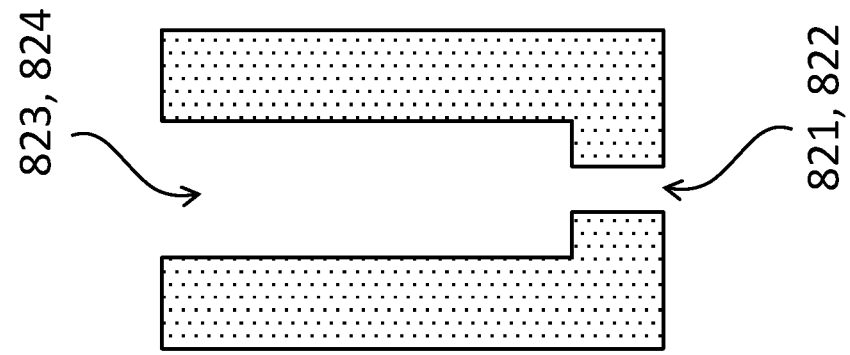
Figure 8C:
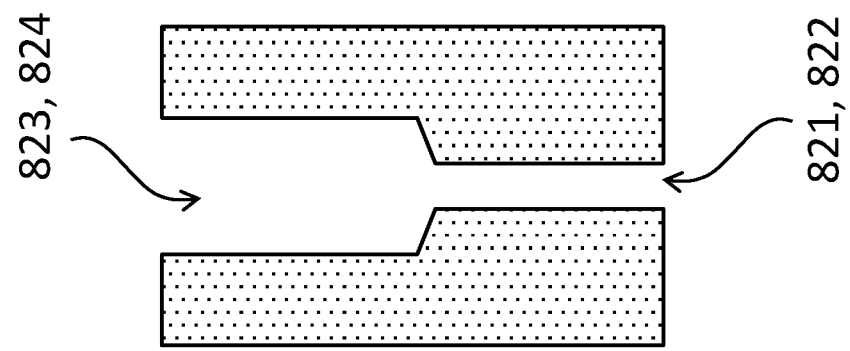
Figure 8D:
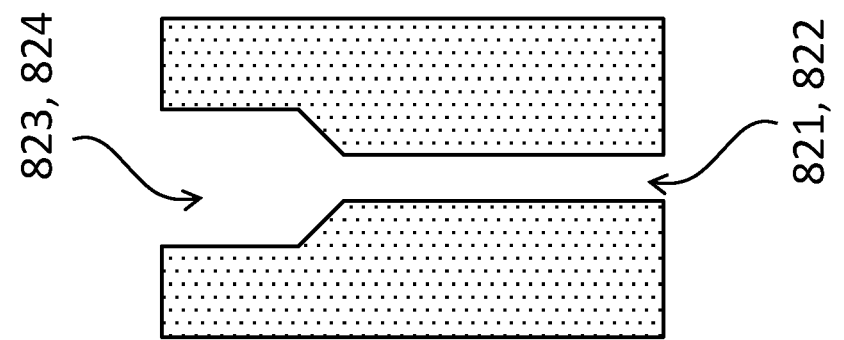

Referring to FIGS. 8A to 8D, the geometry forms of the inside structure of the through holes is diverse. As previously discussed, the first hole 821 and the third hole 823 can be located in the first zone, while the second hole 822 and the fourth hole 824 can be located in the second zone. For instance, although the total length of the through hole is unchanged, the length of the first hole 821 and the third hole 823, or the length of the second hole 822 and the fourth hole 824, may be arranged in different combinations. For instance, the length of the fourth hole 824 is greater than a length of the second hole 822 as shown in FIG. 8B, and the length of the fourth hole 824 is smaller than a length of the second hole 822 as shown in FIG. 8D. Although not illustrated in FIGS. 8A to 8D, the diameter in the first hole 821 or in the third hole 823 may not be constant. For example, the first hole 821 or the third hole 823 may possess a tapered cross sectional profile.

Moreover, in some embodiments, a portion of the third hole 823 or the fourth hole 824 connect to the first hole 821 or the second hole 822 may include a slope as shown in FIGS. 8C and 8D. Furthermore, even though a portion of the third hole 823 or the fourth hole 824 may include a slope and the diameter thereof is shrunk to a smaller one, a narrowest diameter of the third hole 823 is still greater than a narrowest diameter of the fourth hole 824.

Figure 9:
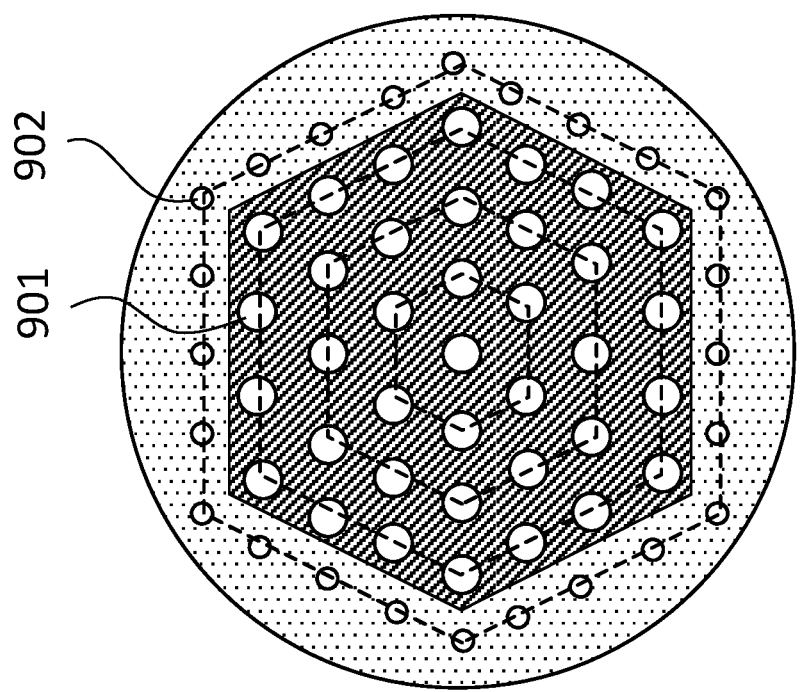
FIG. 9 illustrates a bottom view of a shower head structure in accordance with some embodiments of the present disclosure.

Referring to FIG. 9, in some embodiments, the distribution of the holes may be performed in diverse patterns. For example, the first through holes 901 and the second through holes 902 in FIG. 9 not only may be arranged as concentric distributions as previously shown in FIG. 2A, but also may be arranged as hexagonal distributions. In some embodiments, the distribution of the first through holes 901 and the second through holes 902 may be performs as other regular polygons so that the deposition of the material on the substrate during the PECVD process or the etching result during the plasma-enhanced etching process may be uniformed in each of the directions.

In the present disclosure, a diameter of the through holes in proximal to the edge of the shower head are shrunk and thereby reducing the distance between the sheath layers therein, so that the arcing occurs in PECVD process or plasma-enhanced etching process may be prevented. Particularly, in the process with low pressure, for instance, manufacturing low-k films with a pressure lower than about 8 torr, the arcing may not occur inside the through holes in proximal to the edge of the shower head due to the diameter reduction. Consequently, the lifetime of the shower head may be extended and thus not only the spending on the PECVD apparatus is reduced, but also the downtime for replacing the shower head is avoided.

In one exemplary aspect, a shower head structure is provided. The shower head structure includes: a plate body, a plurality of first through holes, and a plurality of second through holes. The plate body has a first surface with a first zone and a second zone. The first through holes are in the first zone, each of the first through holes has a diameter uniform with others of the first through holes. The second through holes are in the second zone. The first zone is in connection with the second zone, and the diameter of each of the first through holes is greater than a diameter of each of the second through holes.

In another exemplary aspect, a shower head structure is provided. The shower head includes: a plate body, a first hole, a second hole, a third hole, and a fourth hole. The plate body has a first surface and a second surface opposite to the first surface, and the plate body includes a first zone and a second zone. The first hole opens at the first surface and in the first zone. The second hole opens at the first surface and in the second zone. The third hole opens at the second surface, in the first zone, and in connection with the first hole. The fourth hole opens at the second surface, in the second zone, and in connection with the second hole. The diameter of the third hole is greater than the diameter of the fourth hole.

In yet another exemplary aspect, a plasma processing apparatus is provided. The plasma processing apparatus includes: a chamber, a radio frequency (RF) power source, a shower head, and a susceptor. The RF power source is coupled to the chamber. The shower head is in the chamber and coupled to the RF power source. The susceptor is below the shower head, and a first surface of the shower head faces the susceptor. The first surface of the shower head having a plurality of first through holes in a first zone, and a plurality of second through holes in a second zone, and a diameter of each of the first through holes is greater than a diameter of each of the second through holes.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A shower head structure, comprising:
a plate body having a first surface with a first zone and a second zone;
a plurality of first through holes in the first zone, each of the first through holes having a diameter uniform with others of the first through holes; and
a plurality of second through holes in the second zone;
wherein the first zone is in connection with the second zone, the first zone is at the central region of the plate body, the second zone is at the peripheral region of the plate body, the diameter of each of the first through holes is greater than a diameter of each of the second through holes, and the diameter of each of the second through holes is less than 2 times of a thickness of a Debye sheath layer;
wherein the plurality of second through holes are arranged in at least a first band and a second band concentrically, and the second through holes in the second band is staggerly disposed with respect to the second through holes in the first band;
wherein an amount of gas flow through the plurality of first through holes in the first zone per unit area is substantially equal to an amount of gas flow through the plurality of second through holes in the second zone per unit area; and
wherein an area of the first through holes per unit area is equal to an area of the second through holes per unit area, and an amount of the first through holes per unit area is less than an amount of the second through holes per unit area.

2. The shower head structure of claim 1, wherein a ratio between a diameter of the first zone and a diameter of the plate body is in a range of from about 0.7:1 to about 0.8:1.

3. The shower head structure of claim 1, wherein the diameter of each of the second through holes is less than 0.6 mm.

4. The shower head structure of claim 1, wherein the diameter of each of the second through holes is less than 90% of the diameter of each of the first through holes.

5. A shower head structure, comprising:
a plate body having a first surface and a second surface opposite to the first surface, the plate body comprising a first zone and a second zone, wherein gas flows through the plate body from the first surface toward the second surface during operation, the first zone is surrounded by the second zone, and an amount of gas flow through the plate body in the first zone per unit area is substantially equal to an amount of gas flow through the plate body in the second zone per unit area;
a plurality of first holes open at the first surface and in the first zone;
a plurality of second holes open at the first surface and in the second zone;
a plurality of third holes open at the second surface, in the first zone, and each of the third holes being in connection with each of the first holes;
a plurality of fourth holes open at the second surface, in the second zone, and each of the fourth holes being in connection with each of the second holes;
wherein a diameter of each of the second holes is less than 2 times of a thickness of a Debye sheath layer; and
wherein an area of the first holes per unit area at the first surface is equal to an area of the second holes per unit area at the first surface, and an amount of the first holes per unit area is less than an amount of the second holes per unit area.

6. The shower head structure of claim 5, wherein the diameter of the third hole is substantially equal to or greater than the diameter of the first hole.

7. The shower head structure of claim 5, wherein the second zone is a band region from about 0.7 times of a radius of the shower head structure to an edge of the shower head structure.

8. The shower head structure of claim 5, wherein the plurality of second holes being arranged in at least a first band and a second band concentrically.

9. The shower head structure of claim 5, wherein a narrowest diameter of the third hole is greater than a narrowest diameter of the fourth hole.

10. The shower head structure of claim 5, wherein a length of the fourth hole is greater than a length of the second hole.

11. The shower head structure of claim 5, wherein the diameter of the second hole is less than 0.5 mm.

12. A plasma processing apparatus, comprising: a chamber; a radio frequency (RF) power source coupled to the chamber; a shower head in the chamber and coupled to the RF power source, wherein the shower head is configured to provide a uniform amount of gas flow per unit area across the entire shower head; and a susceptor below the shower head, and a first surface of the shower head facing the susceptor; wherein the first surface of the shower head having a plurality of first through holes in a first zone, and a plurality of second through holes in a second zone, the first zone is surrounded by the second zone; wherein first diameters of the first through holes are substantially equal, second diameters of the second through holes are substantially equal, the first diameter is greater than the second diameter and the second diameter of each of the second through holes is less than 2 times of a thickness of a Debye sheath layer; wherein a percentage of a total area of the second through holes to a total area of the second zone at the first surface is substantially equal to a percentage of a total area of the first through holes to a total area of the first zone at the first surface; and wherein an area of the first through holes per unit area is equal to an area of the second through holes per unit area, and an amount of the first through holes per unit area is less than an amount of the second through holes per unit area.

13. The apparatus of claim 12, wherein the first zone is from a center to about 0.7 time of a radius of the shower head.

14. The apparatus of claim 12, wherein an amount of the first through holes per unit area is less than or equal to an amount of the second through holes per unit area.

15. The apparatus of claim 12, wherein an edge of the shower head is physically connected to the RF power source.

16. The apparatus of claim 12, further comprising:
a blocker plate over the shower head in the chamber; and
a heater below the susceptor.

17. The shower head structure of claim 1, wherein the second zone is a band region surrounding the first zone.

18. The shower head structure of claim 1, wherein respective diameters of the second through holes are uniform.

19. The shower head structure of claim 5, wherein respective diameters of the first holes are uniform, respective diameters of the second holes are uniform, respective diameters of the third holes are uniform, and respective diameters of the fourth holes are uniform.

20. The shower head structure of claim 12, wherein the plurality of second through holes are arranged in at least a first band and a second band concentrically, and the second through holes in the second band is staggerly disposed with respect to the second through holes in the first band.

* * * * *